(12) United States Patent
Kizaki

(10) Patent No.: US 7,851,980 B2
(45) Date of Patent: Dec. 14, 2010

(54) TUNING FORK FLEXURAL CRYSTAL VIBRATION DEVICE, CRYSTAL VIBRATOR, AND CRYSTAL OSCILLATOR

(75) Inventor: Shigeru Kizaki, Tokyo (JP)

(73) Assignees: Kyocera Kinseki Corporation, Tokyo (JP); Kyocera Kinseki Hertz Corporation, Tokyo (JP)

( * ) Notice: Subject to any disclaimer, the term of this patent is extended or adjusted under 35 U.S.C. 154(b) by 464 days.

(21) Appl. No.: 12/079,635

(22) Filed: Mar. 27, 2008

(65) Prior Publication Data

US 2008/0238557 A1      Oct. 2, 2008

(30) Foreign Application Priority Data

Mar. 30, 2007    (JP) .............................. 2007-094737

(51) Int. Cl.
  *H01L 41/08* (2006.01)
  *H01L 41/053* (2006.01)
(52) U.S. Cl. .................. 310/370; 310/344; 310/348
(58) Field of Classification Search ................. 310/344, 310/348, 370
  See application file for complete search history.

(56) References Cited

FOREIGN PATENT DOCUMENTS

| JP | 53-093792 A | 8/1978 |
|---|---|---|
| JP | 56-065517 A | 6/1981 |
| JP | 2004-129181 A | 4/2004 |
| JP | 2004-297343 A | 10/2004 |

*Primary Examiner*—Thomas M Dougherty
(74) *Attorney, Agent, or Firm*—Blakely, Sokoloff, Taylor & Zafman LLP

(57) ABSTRACT

A tuning fork flexural crystal vibration device includes a base, two vibration arms, grooves, electrodes, and wirings. The base has a flat plate shape. The two vibration arms have flat panel shapes extending from a side surface of the base in the same direction. The grooves are provided for the two vibration arms so as to extend from base-side end portions of the vibration arms along the longitudinal direction of the vibration arms and are depressed in the thickness direction of the vibration arms. The grooves include front-side grooves which open in the front main surfaces of the vibration arms and are provided at least one by one for each vibration arm, and rear-side grooves which open in the rear main surfaces of the vibration arms and are provided at least one by one for each vibration arm. The bottom surface of the front-side groove does not face the bottom surface of the rear-side groove provided in the same vibration arm in which the front-side groove is provided. The electrodes are formed on the surfaces of the base and the two vibration arms. The wirings electrically connect the electrodes to each other. A crystal vibrator and crystal oscillator are also disclosed.

8 Claims, 10 Drawing Sheets

TUNING FORK FLEXURAL CRYSTAL VIBRATION DEVICE, CRYSTAL VIBRATOR, AND CRYSTAL OSCILLATOR

BACKGROUND OF THE INVENTION

The present invention relates to a tuning fork flexural crystal vibration device, a crystal vibrator incorporating the crystal vibration device, and a crystal oscillator incorporating the crystal vibration device or the crystal vibrator.

A crystal vibrator or crystal oscillator incorporating a tuning fork flexural crystal vibration device as one of electronic components is mounted and used as a reference signal source or clock signal source in an electronic device such as a computer, a cellular phone, or a compact information device. Strong demands for downsizing, lower profile, and cost reduction have been conventionally imposed on the crystal vibrator and crystal oscillator. A conventional tuning fork flexural crystal vibration device will be described below with reference to the accompanying drawings.

Referring to FIGS. 9A, 9B, and 10, in a tuning fork flexural crystal vibration device 100, various types of electrodes, e.g., vibration electrodes, frequency adjustment electrodes, external connection electrodes to electrically connect to a packing container are formed on the surface of a crystal piece 110 having a tuning fork-like outer shape when viewed from the top. The tuning fork flexural crystal vibration device 100 has a thickness of about 100 μm and roughly comprises a base 101 and first and second vibration arms 102 and 103 protruding from one side of the base 101 in the same direction. The outer shape of the crystal piece 110 of the tuning fork flexural crystal vibration device 100 is generally formed by photolithography and chemical etching.

The first vibration arm 102 is provided with a first groove 104 having an opening in the front main surface of the arm, with the long side of the opening extending along the longitudinal direction of the first vibration arm 102. The second vibration arm 103 is provided with a second groove 106 having an opening in the front main surface of the arm, with the long side of the opening extending along the longitudinal direction of the second vibration arm 103. Each of these grooves has a depth of about 60 μm.

Referring to FIGS. 9A and 9B, an electrode 121 is mainly formed in the first groove 104 in the front main surface of the first vibration arm 102, and an electrode 122 is formed on the rear main surface of the first vibration arm 102. The two electrodes are electrically connected to each other. In addition, the electrodes 121 and 122 are electrically connected to the side surface electrodes (not shown) provided on the two side surfaces of the second vibration arm 103. The electrodes 121 and 122 are lead to an external connection electrode 124 via a wiring 123, thereby forming one terminal network.

On the other hand, the side surface electrodes (not shown) provided on the two side surfaces of the first vibration arm 102 are electrically connected to each other. These electrodes are mainly electrically connected to an electrode 125 in the second groove 106 in the front main surface of the second vibration arm 103 and an electrode 126 on the rear main surface, and are lead to an external connection electrode 128 via a wiring 127, thereby forming one terminal network. Consequently, two heteropolar terminal networks are formed in the tuning fork flexural crystal vibration device 100.

An alternating voltage is applied between the two terminal networks. In a momentary state, for example, the two side surface electrodes of the first vibration arm 102 are set at a + (positive) potential, and the electrodes 121 and 122 are set at a − (negative) potential. An electrical field is generated from + to −. In the second vibration arm 103, the polarities of the respective electrodes are reversed to those of the respective electrodes provided on the first vibration arm 102. These electrical fields generate expansion and contraction in the vibration arms 102 and 103 made of a crystal material to flex them. Providing the grooves 104 and 106 in the vibration arms 102 and 103, respectively, can reduce the crystal impedance (to be referred to as the CI hereinafter) of the tuning fork flexural crystal vibration device to a value as small as 100 kΩ or less (see Japanese Patent Laid-Open No. 53-93792 (reference 1) and Japanese Patent Laid-Open No. 56-65517 (reference 2)).

Another example of the conventional tuning fork flexural crystal vibration device is a device provided with a groove having an opening in the front main surface of each vibration arm and a groove having an opening in the rear main surface of each vibration arm, with the bottom surfaces of the two grooves facing each other in each vibration arm (see Japanese Patent Laid-Open No. 2004-297343 (reference 3) and Japanese Patent Laid-Open No. 2004-129181 (reference 4) in addition to references 1 and 2).

The tuning fork flexural crystal vibration device 100 described above or the like is mounted in a recess portion which is formed in an almost rectangular parallelepiped packing container made of an insulating material and has an opening in one main surface of the packing container. This mounted tuning fork flexural crystal vibration device is electrically connected to a plurality of external connection electrodes formed on the outer bottom surface of the packing container, and the recess portion in which the tuning fork flexural crystal vibration device is mounted is hermetically sealed by covering the opening of the recess portion with a cover member, thereby forming a crystal vibrator as an electronic component (see reference 3).

A crystal vibration device has a characteristic that the vibration frequency changes with a change in temperature (to be referred to as a "temperature characteristic" hereinafter). A temperature characteristic graph representing the relationship between temperature and frequency deviation amount in a tuning fork flexural crystal vibration device which flexurally vibrates exhibits a quadratic curve (parabola) with an upward convex shape having a predetermined temperature as a peak temperature.

In general, the temperature characteristic of a crystal vibration device or the like is expressed with reference to +25° C. A crystal vibration device, crystal vibrator, or crystal oscillator is required to have a temperature characteristic that, for example, a desired frequency deviation or less is obtained in the range of +60° C. on the high-temperature side to −10° C. on the low-temperature side, and frequency changes occur in a balanced manner on the high-temperature side and the low-temperature side.

However, the tuning fork flexural crystal vibration device 100 having the grooves with the above shapes and the crystal vibrator or crystal oscillator incorporating the tuning fork flexural crystal vibration device have a temperature characteristic with its peak temperature deviating from +25° C., as shown in FIG. 8. FIG. 8 shows a temperature characteristic with a peak temperature of +20° C. (the broken line portion) as an example of the temperature characteristic of the tuning fork flexural crystal vibration device 100. In this case, since the peak temperature deviates from the reference temperature to the low-temperature side, the frequency deviation amount on the high-temperature side becomes larger than that on the low-temperature side. That is, the temperature characteristic is out of balance with reference to +25° C. In addition, when, for example, a criterion for non-defective products is a deviation amount of −40 [ppm], a frequency deviation becomes equal to or more than a desired frequency deviation on the high-temperature side, and hence the device may be determined as defective.

In a tuning fork flexural crystal vibration device in which grooves are formed in the front and rear main surfaces of each vibration arm with the bottom surfaces of the two grooves facing each other, it is not easy to form grooves with the bottom surfaces of the two grooves accurately facing each other. This formation process requires complicated manufacturing steps, and hence may lead to low productivity.

SUMMARY OF THE INVENTION

It is an object of the present invention to provide a tuning fork flexural crystal vibration device which makes the peak temperature of a temperature characteristic coincide with a reference temperature while suppressing a CI value to a conventional value or less, and a crystal vibrator or crystal oscillator which incorporates the tuning fork flexural crystal vibration device.

According to the present invention, there is provided a tuning fork flexural crystal vibration device comprising a base having a flat plate shape, two vibration arms having flat panel shapes extending from a side surface of the base in the same direction, a plurality of grooves which are provided for the two vibration arms so as to extend from base-side end portions of the vibration arms along a longitudinal direction of the vibration arms and are depressed in a thickness direction of the vibration arms, the plurality of grooves including front-side grooves which open in front main surfaces of the vibration arms and are provided at least one by one for each vibration arm, and rear-side grooves which open in rear main surfaces of the vibration arms and are provided at least one by one for each vibration arm, and the front-side groove having a bottom surface not facing a bottom surface of the rear-side groove provided in the same vibration arm in which the front-side groove is provided, a plurality of electrodes which are formed on surfaces of the base and the two vibration arms, and wirings which electrically connect the plurality of electrodes to each other.

DESCRIPTION OF THE PREFERRED EMBODIMENT

Figure 1A:
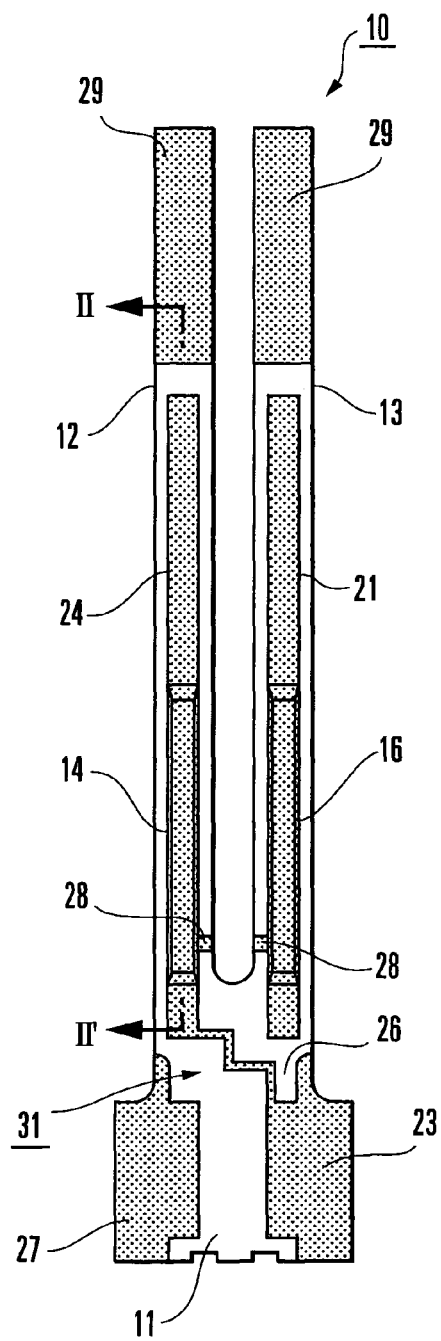
FIG. 1A is a plan view showing a tuning fork flexural crystal vibration device according to the first embodiment of the present invention when viewed from the front main surface side.

Embodiments of a tuning fork flexural crystal vibration device, crystal vibrator, and crystal oscillator according to the present invention will be described below with reference to the accompanying drawings. In the drawings, for the sake of clear description, part of the structure is not illustrated, and some of the sizes of the structure are exaggerated. The thickness of each portion, in particular, is exaggerated.

First Embodiment

Figure 1B:
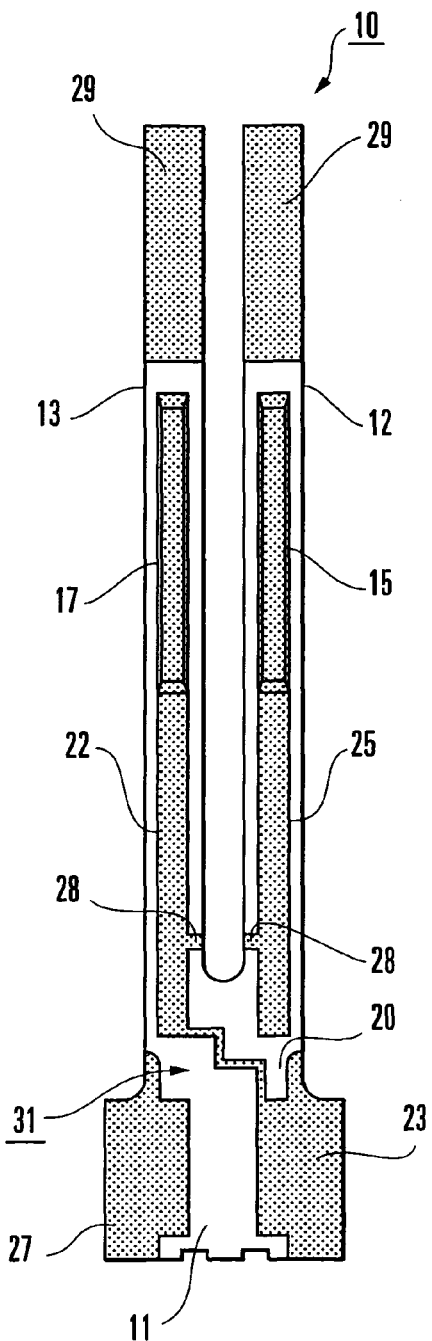
FIG. 1B is a plan view showing the tuning fork flexural crystal vibration device in FIG. 1A when viewed from the rear main surface side.

An example of a tuning fork flexural crystal vibration device according to the first embodiment of the present invention will be described with reference to FIGS. 1A, 1B to 3A, and 3B. As shown in FIGS. 1A and 1B, a tuning fork flexural crystal vibration device 10 according to the first embodiment of the present invention is obtained by forming electrodes and wirings (to be described later) on the surface of a crystal piece 31 like that shown in FIGS. 3A and 3B, which is made of a crystal material having a tuning fork-like outer shape.

The crystallographic axis direction of the crystal piece 31 of the tuning fork flexural crystal vibration device 10 is defined such that the widthwise direction, longitudinal direction, and thickness direction of the crystal piece 31 are set to the X-axis direction, Y'-axis direction, and Z'-axis direction, respectively. The crystal piece 31 comprises a base 11 having an almost rectangular flat plate shape when viewed from the top and first and second vibration arms 12 and 13 integrally protruding from one side surface of the base 11 in the same direction.

The following are examples of the sizes of the crystal piece 31. The size of the base 11 in the longitudinal direction is about 560 μm. The length of the two vibration arms (the length from the connection boundary line of the base 11 to the distal end of each vibration arm) is about 1,100 μm. The total length of the tuning fork flexural crystal vibration device 10 is about 1,660 μm. The width of each of the vibration arms 12 and 13 is about 123 μm. The gap between the first and second vibration arms 12 and 13 is about 82 μm. The thickness of the crystal piece 31, excluding the grooves to be described later, is about 100 μm.

Figure 2:
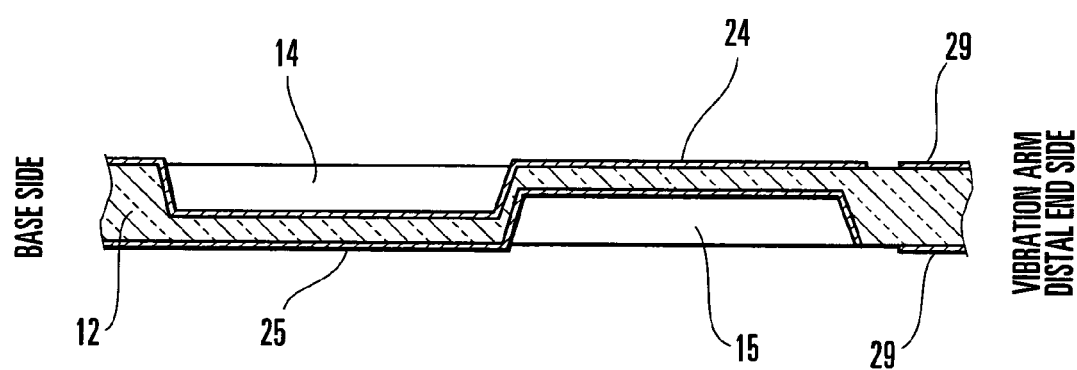
FIG. 2 is a partial sectional view, taken along the virtual cutting line II-II' in FIG. 1A, of the tuning fork flexural crystal vibration device.

The first vibration arm 12 has a first groove (front-side groove) 14 and a second groove (rear-side groove) 15. The first groove 14 has an opening in the front main surface of the first vibration arm 12, with the long side of the opening extending along the longitudinal direction of the first vibration arm 12, and is depressed in the thickness direction of the first vibration arm 12. The second groove 15 has an opening in the rear main surface of the first vibration arm 12, with the long side of the opening extending along the longitudinal direction of the first vibration arm 12, and is depressed in the thickness direction of the first vibration arm 12. The inner bottom surface of the first groove 14 does not face that of the second groove 15 in the first vibration arm 12, and the inner side wall surface of the first groove 14 on the vibration arm distal end side faces the inner side wall surface of the second groove 15 on the base side in the first vibration arm 12. FIG. 2 shows how the first and second grooves 14 and 15 are formed in the first vibration arm 12.

In the first and second grooves 14 and 15, the angles defined by the inner bottom surfaces of the grooves 14 and 15 and the inner side wall surfaces of the grooves 14 and 15 on the base side are obtuse angles, and so are the angles defined by the inner bottom surface of the grooves 14 and 15 and the inner side wall surfaces of the grooves 14 and 15 on the vibration arm distal end side. This is because, since the grooves 14 and 15 are formed by a chemical etching method, the etching characteristic varies depending on the crystallographic orientation of the crystal piece 31 of the tuning fork flexural crystal vibration device 10.

The second vibration arm 13 has a third groove (front-side groove) 16 and a fourth groove (rear-side groove) 17. The third groove 16 has an opening in the front main surface of the second vibration arm 13, with the long side of the opening extending along the longitudinal direction of the second vibration arm 13, and is depressed in the thickness direction of the second vibration arm 13. The fourth groove 17 has an opening in the rear main surface of the second vibration arm 13, with the long side of the opening extending along the longitudinal direction of the second vibration arm 13, and is depressed in the thickness direction of the second vibration arm 13. The inner bottom surface of the third groove 16 does not face that of the fourth groove 17 in the second vibration arm 13, and the inner side wall surface of the third groove 16 on the vibration arm distal end side faces the inner side wall surface of the fourth groove 17 on the base side in the second vibration arm 13.

In the third and fourth grooves 16 and 17, as in the first and second grooves 14 and 15, the angles defined by the inner bottom surfaces of the grooves 16 and 17 and the inner side wall surfaces of the grooves 16 and 17 on the base side are obtuse angles, and so are the angles defined by the inner bottom surface of the grooves 16 and 17 and the inner side wall surfaces of the grooves 16 and 17 on the vibration arm distal end side.

The base-side end portions of the first and third grooves 14 and 16 in the longitudinal direction are located on the connection boundary line between the base 11 and each vibration arm. The opening of each of the grooves 14 and 16 has a width of about 93 μm and a length of about 350 μm. The depth of each opening from the main surface of each of the vibration arms 12 and 13 to the bottom surface of each of the grooves 14 and 16 falls within the range of sizes corresponding to 3/10 to 9/10 of the thickness of each of the vibration arms 12 and 13.

That is, if the vibration arms 12 and 13 each have a thickness of 100 μm, the grooves 14 and 16 each have a depth falling in the range of 30 to 90 μm.

Referring to FIGS. 1A, 1B, and 2, the side-surface electrodes (not shown) formed on the two side surfaces of the first vibration arm 12, an electrode 21 formed on the front main surface of the second vibration arm 13 which includes the inner surface of the third groove 16, and an electrode 22 formed on the rear main surface of the second vibration arm 13 which includes the inner surface of the fourth groove 17 are electrically connected to each other by using a wiring 20 and the like formed on the rear main surface and are connected to an external connection electrode 23, thereby forming one terminal network.

The side-surface electrodes (not shown) formed on the two side surfaces of the second vibration arm 13, an electrode 24 formed on the front main surface of the first vibration arm 12 which includes the inner surface of the first groove 14, and an electrode 25 formed on the rear main surface of the first vibration arm 12 which includes the inner surface of the second groove 15 are electrically connected to each other by using a wiring 26 and the like formed on the front main surface and are connected to an external connection electrode 27, thereby forming one terminal network. With this process, electrode networks for a total of two terminals are formed.

The electrodes 24 and 25 formed on the first vibration arm 12 and the electrodes 21 and 22 formed on the second vibration arm 13 are electrically connected to each other, respectively, via portions of the side surfaces of the vibration arms 12 and 13 by using bands (wirings) 28 formed on the forked portion between the first vibration arm 12 and the second vibration arm 13. A metal film 29 for frequency adjustment is formed on the distal end portion of each of the vibration arms 12 and 13 (within the range of 30% of the length from the distal end face). One of Au, Ag, and Pd is used as the material for the metal film 29.

Second Embodiment

An example of a tuning fork flexural crystal vibration device according to the second embodiment of the present invention will be described next with reference to FIGS. 4A and 4B. As shown in FIGS. 4A and 4B, a crystal piece 41 of the tuning fork flexural crystal vibration device according to the second embodiment of the present invention mainly comprises a base 11, a first vibration arm 12, and a second vibration arm 13. The crystal piece 41 has almost the same shape as that of the crystal piece 31 according to the first embodiment shown in FIGS. 3A and 3B. Note however that each groove is formed in the crystal piece 41 in FIGS. 4A and 4B in the following manner. For example, compared with the first groove 14 shown in FIG. 3A, two grooves 14a and 14b are divisionally formed in the longitudinal direction of the first vibration arm 12 so as to have openings in the front and rear main surfaces of the first vibration arm 12, respectively.

Figure 3A:
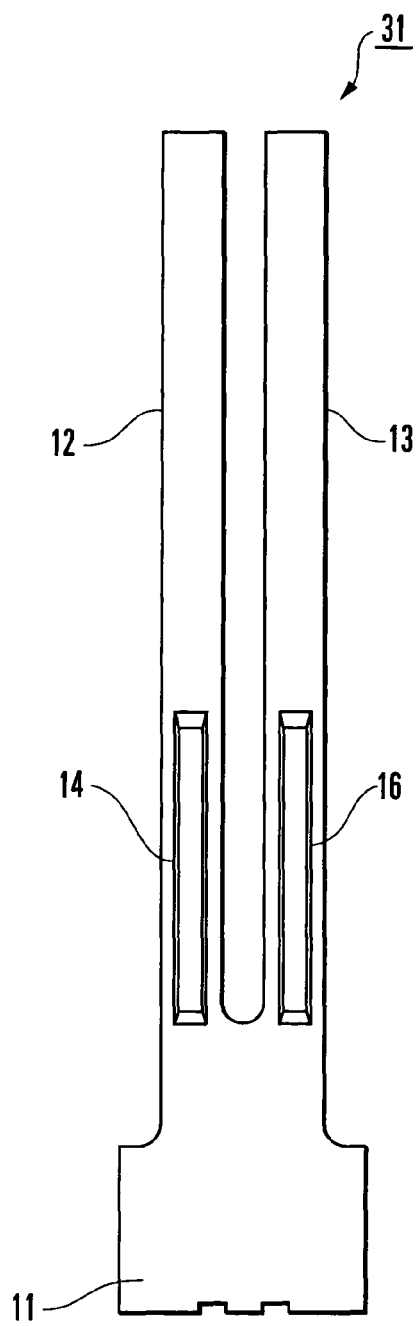
FIG. 3A is a plan view showing a crystal piece of the tuning fork flexural crystal vibration device in FIG. 1A when viewed from the front main surface side.
Figure 3B:
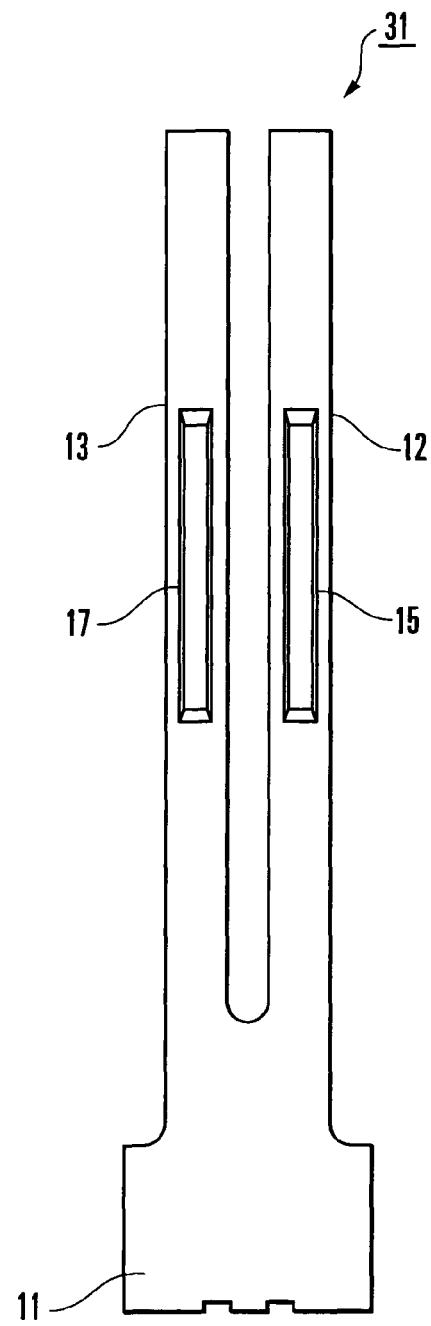
FIG. 3B is a plan view showing the crystal piece in FIG. 3A when viewed from the rear main surface side.
Figure 4A:
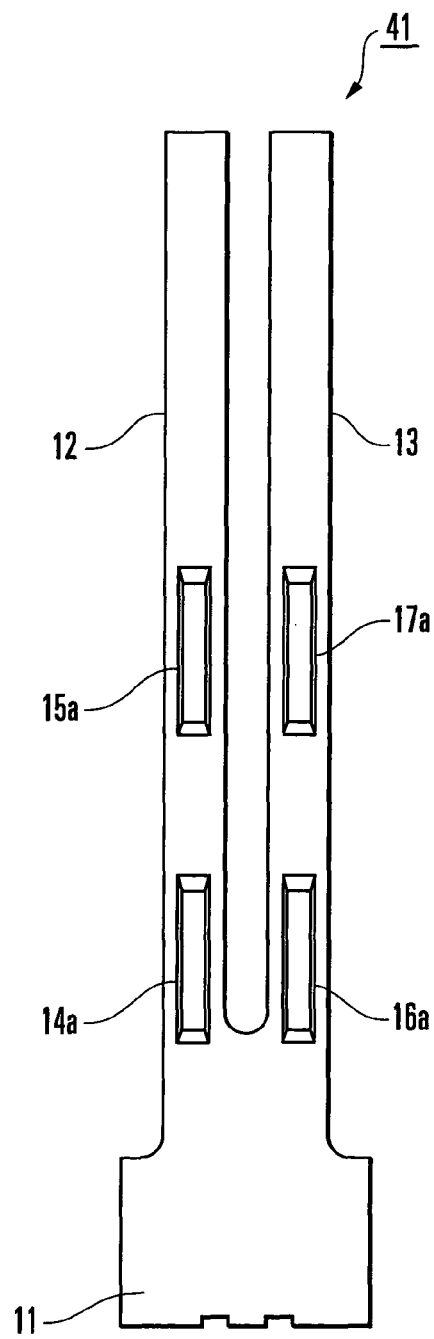
FIG. 4A is a plan view showing a crystal piece of a tuning fork flexural crystal vibration device according to the second embodiment of the present invention when viewed from the front main surface side.
Figure 4B:
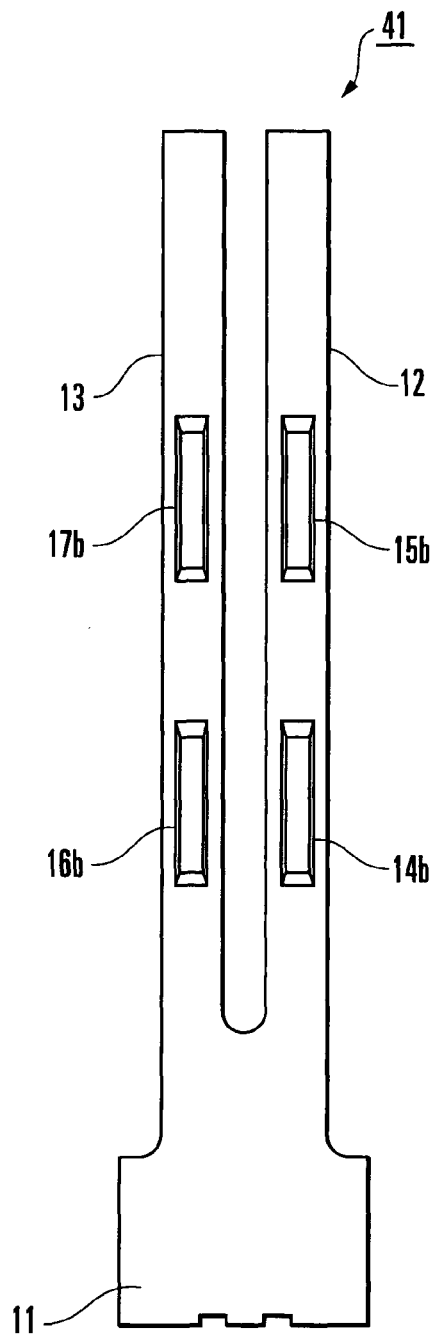
FIG. 4B is a plan view showing the crystal piece in FIG. 4A when viewed from the rear main surface side.

Likewise, compared with the second groove 15 shown in FIG. 3B, two grooves 15a and 15b are divisionally formed in the longitudinal direction of the first vibration arm 12 so as to have openings in the front and rear main surfaces of the first vibration arm 12, respectively. Compared with the third groove 16 shown in FIG. 3A, two grooves 16a and 16b are divisionally formed in the longitudinal direction of the second vibration arm 13 so as to have openings in the front and rear main surfaces of the second vibration arm 13, respectively. Compared with the fourth groove 17 shown in FIG. 3B, two grooves 17a and 17b are divisionally formed in the longitudinal direction of the second vibration arm 13 so as to have openings in the front and rear main surfaces of the second vibration arm 13, respectively.

In addition, the inner bottom surfaces of the grooves (front-side grooves) 14a, 15a, 16a, and 17a having the openings in the front main surfaces of the vibration arms 12 and 13 and the inner bottom surfaces of the grooves (rear-side grooves) 14b, 15b, 16b, and 17b having the openings in the rear main surfaces are provided at positions where they do not face each other in the vibration arms 12 and 13.

The inner side wall surface of the groove 14a on the vibration arm distal end side and the inner side wall surface of the groove 14b on the base side face each other in the first vibration arm 12, so do the inner side wall surface of the groove 14b on the vibration arm distal end side and the inner side wall surface of the groove 15a on the base side, and the inner side wall surface of the groove 15a on the vibration arm distal end side and the inner side wall surface of the groove 15b on the base side. The inner side wall surface of the groove 16a on the vibration arm distal end side and the inner side wall surface of the groove 16b on the base side face each other in the second vibration arm 13, so do the inner side wall surface of the groove 16b on the vibration arm distal end side and the inner side wall surface of the groove 17a on the base side, and the inner side wall surface of the groove 17a on the vibration arm distal end side and the inner side wall surface of the groove 17b on the base side.

A tuning fork flexural crystal vibration device is formed by forming electrodes, wirings, and the like similar in form to the electrodes 21, 22, 24, and 25, the wirings 20 and 26, and the like shown in FIGS. 1A and 1B on the crystal piece 41 shown in FIGS. 4A and 4B. The tuning fork flexural crystal vibration device which comprises the crystal piece 41 shown in FIGS. 4A and 4B can have characteristics similar to those of the tuning fork flexural crystal vibration device 10 shown in FIGS. 1A and 1B.

Third Embodiment

Figures 5A, 5B:
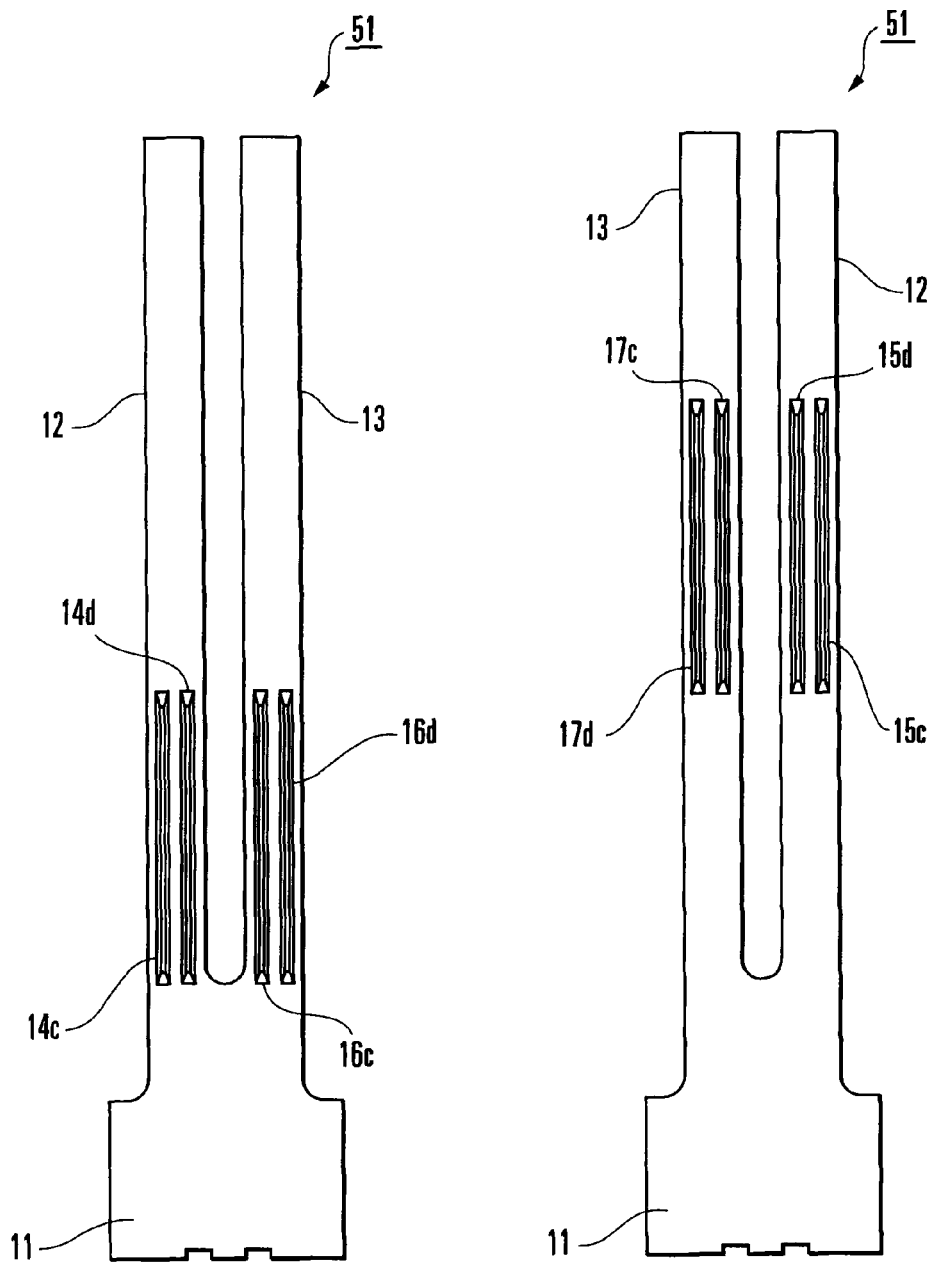
FIG. 5A is a plan view showing a crystal piece of a tuning fork flexural crystal vibration device according to the second embodiment of the present invention when viewed from the front main surface side.
FIG. 5B is a plan view showing the crystal piece in FIG. 5A when viewed from the rear main surface side.

An example of a tuning fork flexural crystal vibration device according to the third embodiment of the present invention will be described next with reference to FIGS. 5A and 5B. As shown in FIGS. 5A and 5B, a crystal piece 51 of the tuning fork flexural crystal vibration device according to the third embodiment of the present invention mainly comprises a base 11, a first vibration arm 12, and a second vibration arm 13. The crystal piece 51 has almost the same shape as that of the crystal piece 31 according to the first embodiment shown in FIGS. 3A and 3B. Note however that each groove is formed in the crystal piece 51 in FIGS. 5A and 5B in the following manner. For example, compared with the first groove 14 shown in FIG. 3A, two grooves 14c and 14d are divisionally formed in the widthwise direction of the first vibration arm 12 so as to have openings in the front main surface of the first vibration arm 12. That is, the grooves 14c and 14d are arranged parallel to the widthwise direction of the vibration arm 12.

Likewise, compared with the second groove 15 shown in FIG. 3B, two grooves 15c and 15d are divisionally formed in the widthwise direction of the first vibration arm 12 so as to have openings in the rear main surface of the first vibration arm 12. Compared with the second groove 16 shown in FIG. 3A, two grooves 16c and 16d are divisionally formed in the widthwise direction of the second vibration arm 13 so as to have openings in the front main surface of the second vibration arm 13. Compared with the fourth groove 17 shown in FIG. 3B, two grooves 17c and 17d are divisionally formed in the widthwise direction of the second vibration arm 13 so as to have openings in the rear main surface of the second vibration arm 13.

The inner bottom surfaces of the grooves (front-side grooves) 14c, 14d, 16c, and 16d having openings in the front main surfaces of the vibration arms 12 and 13 and the inner bottom surfaces of the grooves (rear-side grooves) 15c, 15d, 17c, and 17b having openings in the rear main surfaces of the vibration arms 12 and 13 are provided at positions in the vibration arms 12 and 13 at which they do not face each other.

The inner side wall surface of the groove 14c on the vibration arm distal end side and the inner side wall surface of the groove 15c on the base side respectively face the inner side wall surface of the groove 14d on the vibration arm distal end side and the inner side wall surface of the groove 15d on the base side in the first vibration arm 12. The inner side wall surface of the groove 16c on the vibration arm distal end side and the inner side wall surface of the groove 17c on the base side respectively face the inner side wall surface of the groove 16d on the vibration arm distal end side and the inner side wall surface of the groove 17d on the base side in the second vibration arm 13.

A tuning fork flexural crystal vibration device is formed by forming electrodes, wirings, and the like similar in form to the electrodes 21, 22, 24, and 25, the wirings 20 and 26, and the like shown in FIGS. 1A and 1B on the crystal piece 51 shown in FIGS. 5A and 5B. The tuning fork flexural crystal vibration device which comprises the crystal piece 51 shown in FIGS. 5A and 5B can have characteristics similar to those of the tuning fork flexural crystal vibration device 10 shown in FIGS. 1A and 1B.

Figure 8:
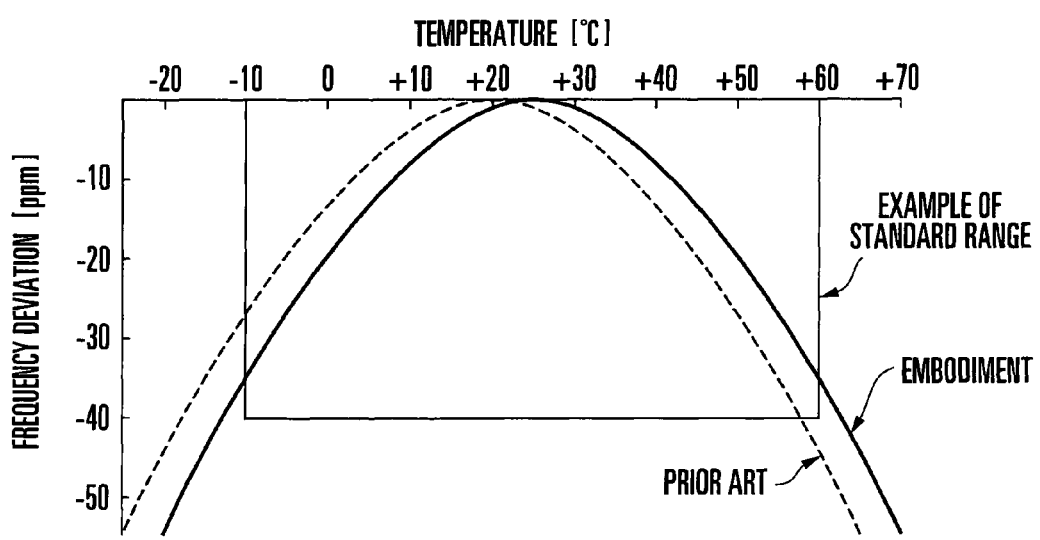
FIG. 8 is a graph showing the temperature characteristics of the tuning fork flexural crystal vibration device according to each embodiment of the present invention and conventional tuning fork flexural crystal vibration device.
Figures 9A, 9B:
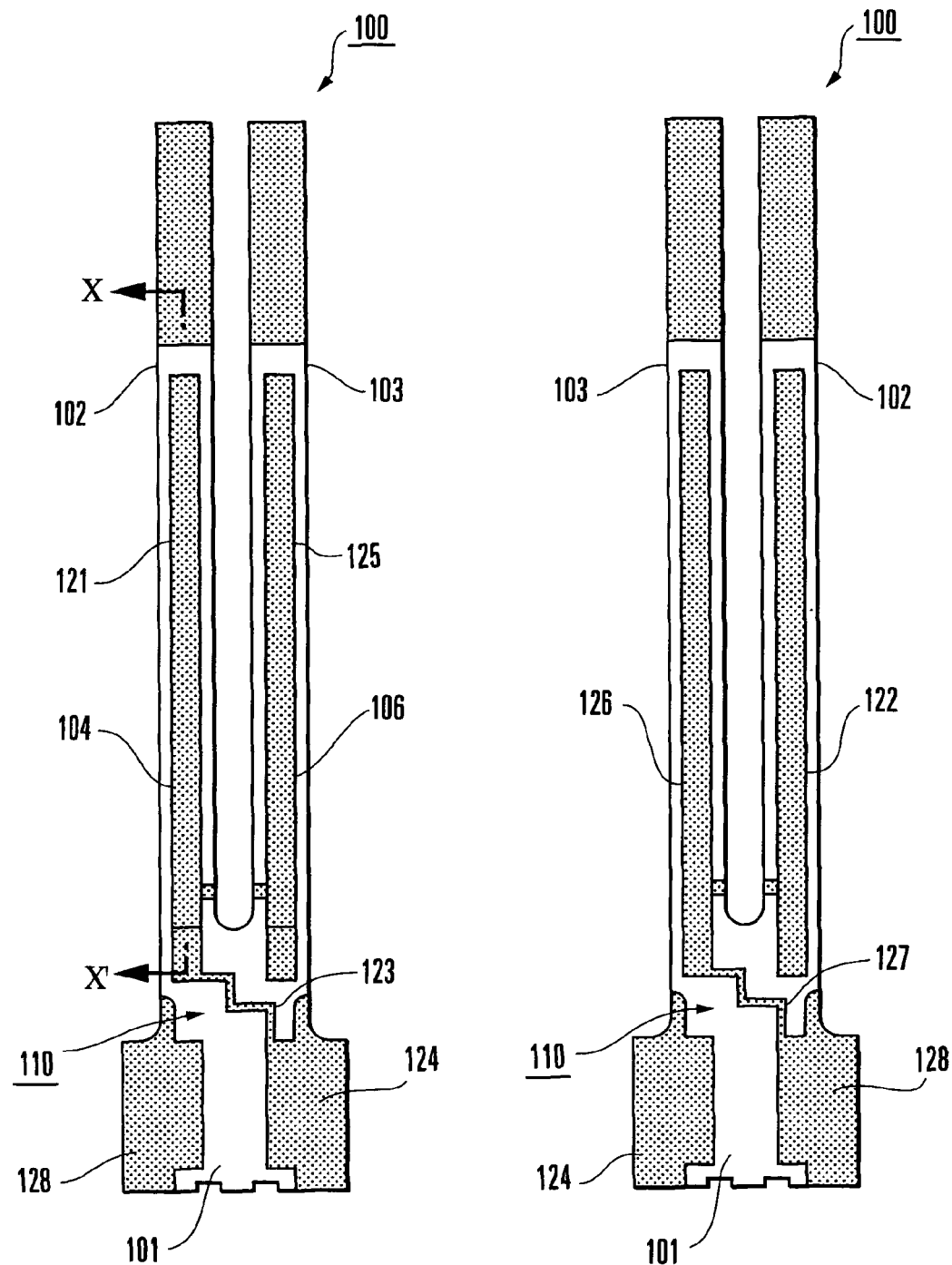
FIG. 9A is a plan view showing the conventional tuning fork flexural crystal vibration device when viewed from the front main surface side.
FIG. 9B is a plan view showing the tuning fork flexural crystal vibration device in FIG. 9A when viewed from the rear main surface side.
Figure 10:
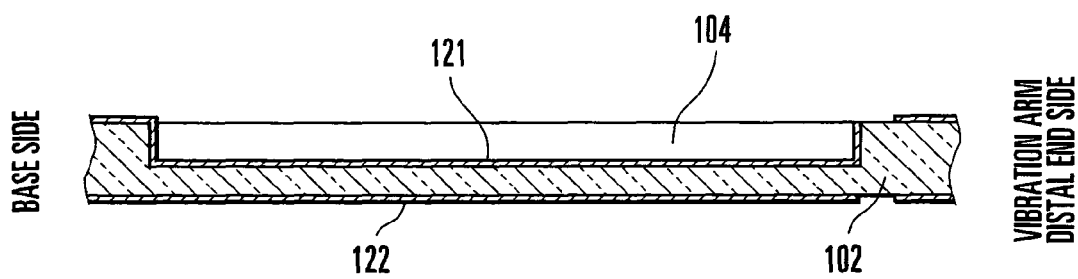
FIG. 10 is a partial sectional view, taken along the virtual cutting line X-X' in FIG. 9A, of the tuning fork flexural crystal vibration device.

FIG. 8 is a graph showing the temperature characteristic of each of the tuning fork flexural crystal vibration devices of the above embodiments which respectively comprise the crystal pieces 31, 41, and 51. As indicated by the solid line in FIG. 8, the temperature characteristic of the tuning fork flexural crystal vibration device of each embodiment is represented by a quadratic curve with an upward convex shape having a peak temperature of +25° C. Such a characteristic can be obtained because forming grooves in the above forms in the crystal pieces 31, 41, and 51 of the tuning fork flexural crystal vibration devices makes it possible to suppress vibrations other than the flexural vibrations of the vibration mode which are produced in the first and second vibration arms 12 and 13 and improve the balance between flexural vibrations produced in the first vibration arm 12 and those in the second vibration arm 13.

Each of the tuning fork flexural crystal vibration devices of the above embodiments which respectively comprise the crystal pieces 31, 41, and 51 has a CI value of about 50 kΩ or less, which is smaller than that of the conventional tuning fork flexural crystal vibration device.

Fourth Embodiment

Figure 6:
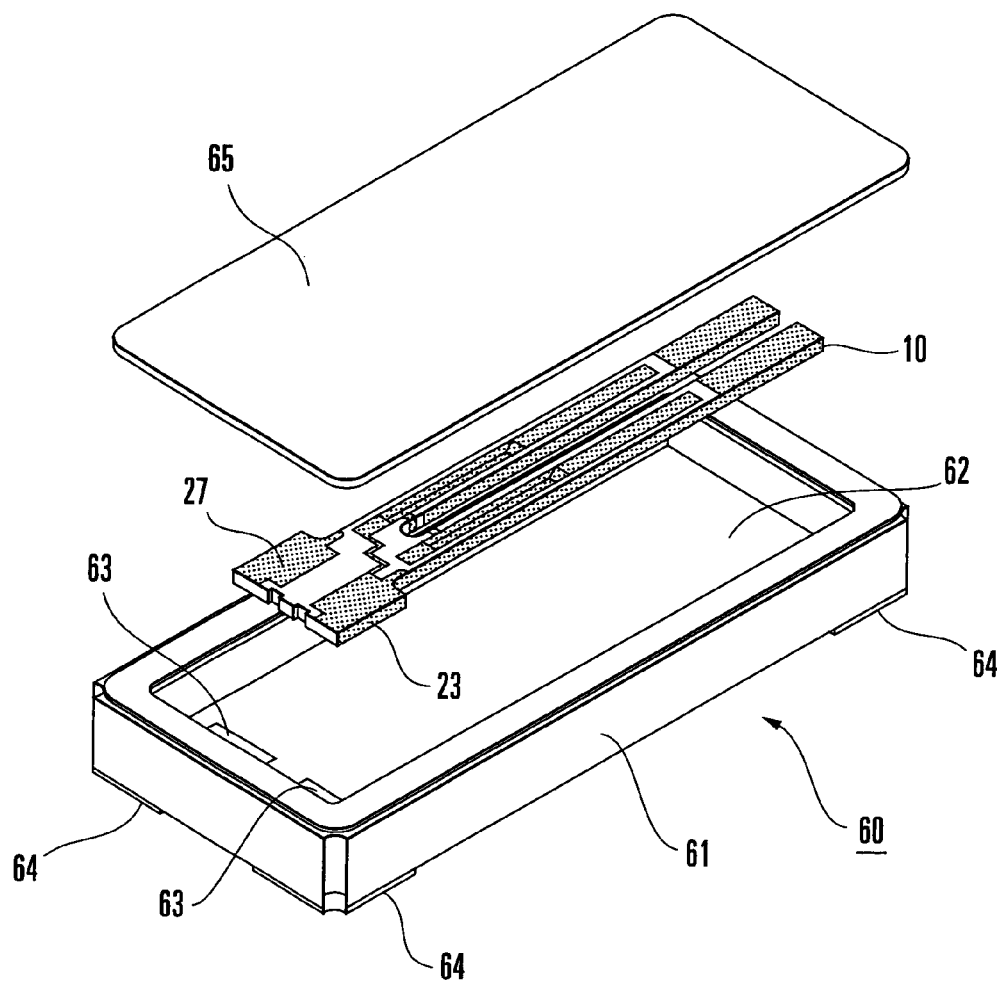
FIG. 6 is an exploded perspective view showing a crystal vibrator according to the fourth embodiment of the present invention.

A crystal vibrator according to the fourth embodiment of the present invention will be described next with reference to FIG. 6. In general, the tuning fork flexural crystal vibration device comprising the crystal piece 31, 41, or 51 is not often provided as it is, but is provided in the form of a crystal vibrator like that shown in FIG. 6. According to a form of this crystal vibrator, for example, the tuning fork flexural crystal vibration device 10 comprising the crystal piece 31 described above is mounted in a recess portion 62 having an opening in one main surface of a packing container 61. The packing container 61 is made of an insulating material and has an almost rectangular parallelepiped shape.

According to a mounting form of the tuning fork flexural crystal vibration device 10, the tuning fork flexural crystal vibration device 10 is mounted such that external connection electrodes 23 and 27 provided on the tuning fork flexural crystal vibration device 10 are placed on a pair of device connection electrode pads 63 formed on one short side edge portion of the inner bottom surface of the recess portion 62, and the device connection electrode pads 63 are conductively fixed to the external connection electrodes 23 and 27 with a conductive bonding material (not shown). The mounted tuning fork flexural crystal vibration device 10 is electrically connected, via the device connection electrode pads 63, to predetermined terminals of a plurality of external connection electrodes 64 formed on the outer bottom surface of the packing container 61. After the tuning fork flexural crystal vibration device 10 is mounted, a cover member 65 is placed on the opening of the recess portion 62, and the recess portion 62 in which the tuning fork flexural crystal vibration device 10 is mounted is evacuated and hermetically sealed, thereby forming a crystal vibrator 60.

Fifth Embodiment

Figure 7:
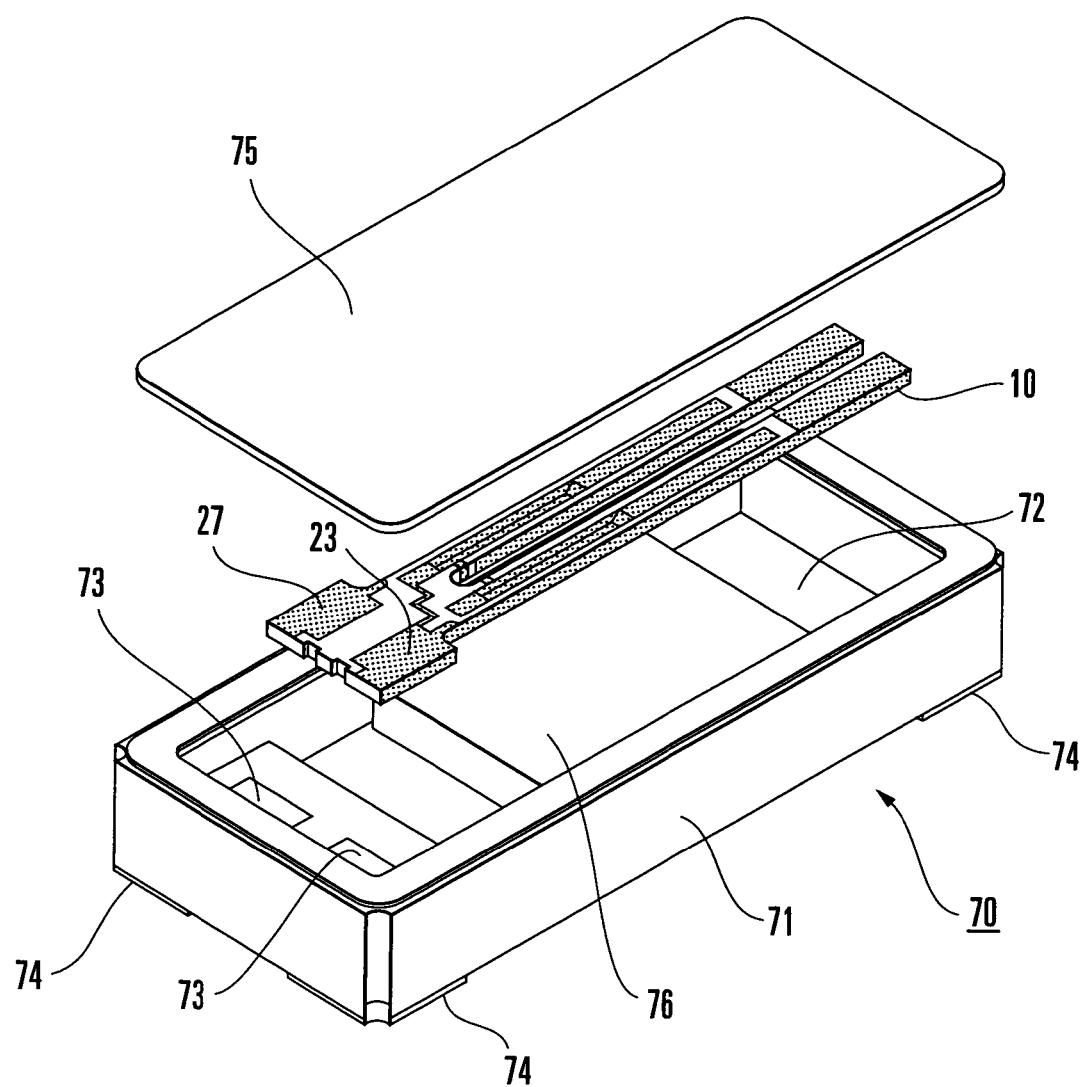
FIG. 7 is an exploded perspective view showing a crystal oscillator according to the fifth embodiment of the present invention.

A crystal oscillator according to the fifth embodiment of the present invention will be described next with reference to FIG. 7. Another form of providing each of the tuning fork flexural crystal vibration devices respectively comprising the crystal pieces 31, 41, and 51 is a crystal oscillator like that shown in FIG. 7. According to an example of this crystal oscillator, the tuning fork flexural crystal vibration device 10 comprising the crystal piece 31 described above is mounted at a predetermined position in a recess portion 72 having an opening in one main surface of a packing container 71, together with an integrated circuit device 76. The packing container 71 is made of an insulating material and has an almost rectangular parallelepiped shape. The integrated circuit device 76 incorporates at least an oscillation circuit to which the electrodes and wirings formed on the surface of the tuning fork flexural crystal vibration device 10 are electrically connected. Note that as the basic structure of the oscillation circuit, a known circuit such as an inverter oscillation circuit or Colpitts oscillation circuit is used.

External connection electrodes 23 and 27 of the mounted tuning fork flexural crystal vibration device 10 are conductively fixed to device connection electrode pads 73, which are provided in the recess portion 72 and electrically connected to predetermined terminals of the integrated circuit device 76, by using a solder, metal bumps, or a conductive bonding material such as a conductive adhesive. Note that a signal output from the oscillation circuit incorporated in the integrated circuit device 76 or a signal output from the oscillation circuit upon having undergone desired processing is output to the outside from a predetermined output terminal of external connection electrodes 74 which is electrically connected to the integrated circuit device 76 via a lead wire in the packing container 71.

After the crystal vibration device 10 and the integrated circuit device 76 are mounted in the recess portion 72 in this manner, a cover member 75 is placed on the opening of the recess portion 72, and the recess portion 72 in which the tuning fork flexural crystal vibration device 10 and the integrated circuit device 76 are mounted is evacuated and hermetically sealed, thereby forming a crystal oscillator 70. In this embodiment, housing the tuning fork flexural crystal vibration device 10 and the integrated circuit device 76 in the packing container 71 will integrate the tuning fork flexural crystal vibration device 10 with the integrated circuit device 76.

As described above, the above embodiment can reduce the CI value of the tuning fork flexural crystal vibration device to about 50 kΩ or less, which is smaller than the CI value of the conventional tuning fork flexural crystal vibration device.

In addition, according to the above embodiment, the peak temperature of the temperature characteristic of the tuning fork flexural crystal vibration device is +25° C., which is the reference temperature. Since the reference temperature coincides with the peak temperature, the difference between the frequency deviation amount on the low-temperature side and that on the high-temperature side is small, and the temperature characteristic is in a well-balanced state with reference to +25° C. Furthermore, the frequency deviations on both the low-temperature side and the high-temperature side can be made to fall within a desired frequency deviation, thereby considerably reducing the chances of the temperature characteristic being degraded.

In addition, according to the above embodiment, since the tuning fork flexural crystal vibration device has the grooves formed in the front and rear main surfaces of the vibration arms so as to avoid the bottom surfaces of the two grooves from facing each other, the grooves can be easily formed. This eliminates the need to provide complicated manufacturing steps, and hence improves the productivity of the tuning fork flexural crystal vibration device.

Therefore, according to the tuning fork flexural crystal vibration device according to the above embodiment and the crystal vibrator or crystal oscillator incorporating the tuning fork flexural crystal vibration device, the peak temperature of the temperature characteristic becomes +25° C. while the CI value is suppressed to a value equal to or less than the conventional value, thereby improving each characteristic described above.

The present invention is not limited to the above embodiments, and can be changed and modified within the spirit and scope of the invention. For example, in the above embodiments, one or two grooves having openings in each of the front and rear main surfaces of one vibration arm are formed. However, the number of grooves is not limited to those in the above embodiments as long as the same effects as those of the present invention can be obtained.

What is claimed is:

1. A tuning fork flexural crystal vibration device comprising:
    a base having a flat plate shape;
    two vibration arms having flat panel shapes extending from a side surface of said base in the same direction;
    a plurality of grooves which are provided for said two vibration arms so as to extend from base-side end portions of said vibration arms along a longitudinal direction of said vibration arms and are depressed in a thickness direction of said vibration arms, said plurality of grooves including front-side grooves which open in front main surfaces of said vibration arms and are provided at least one by one for each vibration arm, and rear-side grooves which open in rear main surfaces of said vibration arms and are provided at least one by one for each vibration arm, and said front-side groove having a bottom surface not facing a bottom surface of said rear-side groove provided in said same vibration arm in which said front-side groove is provided;
    a plurality of electrodes which are formed on surfaces of said base and said two vibration arms; and wirings which electrically connect said plurality of electrodes to each other.

2. A device according to claim 1, wherein
an angle defined by a bottom surface of each groove and a side wall surface of said groove on a base side, and an angle defined by the bottom surface of each groove and a side wall surface of said groove on a vibration arm distal end side are obtuse angles, and
a side wall surface of said front-side groove on the base side faces a side wall surface of said rear-side groove on the vibration arm distal end side which is provided in said same vibration arm in which said front-side groove is provided.

3. A device according to claim 1, wherein
an angle defined by a bottom surface of each groove and a side wall surface of said groove on a base side, and an angle defined by the bottom surface of each groove and a side wall surface of said groove on a vibration arm distal end side are obtuse angles, and
a side wall surface of said front-side groove on the vibration arm distal end side faces a side wall surface of said rear-side groove on the base side which is provided in said same vibration arm in which said front-side groove is provided.

4. A device according to claim 1, wherein depths of said plurality of grooves are 3/10 to 9/10 of thicknesses of said two vibration arms.

5. A device according to claim 1, wherein said plurality of front-side grooves and said plurality of rear-side grooves are provided for each vibration arm, said plurality of front-side grooves provided for said same vibration arm are arranged parallel to a widthwise direction of said vibration arm, and said plurality of rear-side grooves provided for said same vibration arm are arranged parallel to the widthwise direction of said vibration arm.

6. A crystal vibrator comprising:
a packing container in which a recess portion having an opening in one main surface is formed;
a tuning fork flexural crystal vibration device which is mounted in the recess portion;
a plurality of external connection electrodes which are formed on an outer bottom surface of said packing container and are electrically connected to said tuning fork flexural crystal vibration device; and
a cover member which is placed on the opening of the recess portion to hermetically seal the recess portion,
said tuning fork flexural crystal vibration device comprising
a base having a flat plate shape,
two vibration arms having flat panel shapes extending from a side surface of said base in the same direction,
a plurality of grooves which are provided for said two vibration arms so as to extend from base-side end portions of said vibration arms along a longitudinal direction of said vibration arms and are depressed in a thickness direction of said vibration arms, said plurality of grooves including front-side grooves which open in front main surfaces of said vibration arms and are provided at least one by one for each vibration arm, and rear-side grooves which open in rear main surfaces of said vibration arms and are provided at least one by one for each vibration arm, and said front-side groove having a bottom surface not facing a bottom surface of said rear-side groove provided in said same vibration arm in which said front-side groove is provided,
a plurality of electrodes which are formed on surfaces of said base and said two vibration arms, and
wirings which electrically connect said plurality of electrodes to each other.

7. A crystal oscillator comprising:
a tuning fork flexural crystal vibration device; and
an oscillation circuit which is electrically connected to said tuning fork flexural crystal vibration device and is integrated with said tuning fork flexural crystal vibration device,
said tuning fork flexural crystal vibration device comprising
a base having a flat plate shape,
two vibration arms having flat panel shapes extending from a side surface of said base in the same direction,
a plurality of grooves which are provided for said two vibration arms so as to extend from base-side end portions of said vibration arms along a longitudinal direction of said vibration arms and are depressed in a thickness direction of said vibration arms, said plurality of grooves including front-side grooves which open in front main surfaces of said vibration arms and are provided at least one by one for each vibration arm, and rear-side grooves which open in rear main surfaces of said vibration arms and are provided at least one by one for each vibration arm, and said front-side groove having a bottom surface not facing a bottom surface of said rear-side groove provided in said same vibration arm in which said front-side groove is provided,
a plurality of electrodes which are formed on surfaces of said base and said two vibration arms, and
wirings which electrically connect said plurality of electrodes to each other.

8. An oscillator according to claim 7, further comprising:
a packing container in which a recess portion having an opening in one main surface is formed, with said tuning fork flexural crystal vibration device and said oscillation circuit being mounted in the recess portion;
a plurality of external connection electrodes which are formed on an outer bottom surface of said packing container and are electrically connected to said tuning fork flexural crystal vibration device; and
a cover member which is placed on the opening of the recess portion to hermetically seal the recess portion.

* * * * *